United States Patent [19]
Tamegaya

[11] Patent Number: 5,329,183
[45] Date of Patent: Jul. 12, 1994

[54] ECL-CMOS LEVEL CONVERTER CIRCUIT

[75] Inventor: Yukio Tamegaya, Tokyo, Japan

[73] Assignee: NEC Corporation, Tokyo, Japan

[21] Appl. No.: 942,818

[22] Filed: Sep. 10, 1992

[30] Foreign Application Priority Data

Sep. 12, 1991 [JP] Japan .................................. 3-232709

[51] Int. Cl.$^5$ ............... H03K 19/0175; H03K 19/082; H03K 19/094
[52] U.S. Cl. ..................................... 307/475; 307/446
[58] Field of Search ............... 307/446, 475, 364, 570, 307/443

[56] References Cited

U.S. PATENT DOCUMENTS

| 4,939,393 | 7/1990 | Petty ..................................... 307/455 |
| 4,999,523 | 3/1991 | Cham et al. ........................ 307/446 |
| 5,107,141 | 4/1992 | Yano et al. ......................... 307/570 |
| 5,191,240 | 3/1993 | Fleischer ............................ 307/446 |

Primary Examiner—Edward P. Westin
Assistant Examiner—Jon Santamauro
Attorney, Agent, or Firm—Leydig, Voit & Mayer

[57] ABSTRACT

An ECL-CMOS level converter circuit capable of operating at a high speed and having a simple structure, includes a bipolar differential amplifier and a level conversion-logic circuit. The bipolar differential amplifier inputting two voltages from two input terminal and a reference voltage from a reference voltage terminal includes at least two differential transistor parts each being composed of two bipolar transistors. The level conversion-logic circuit includes a MOS OR gate inputting one of differential output voltages output from each differential transistor part via two nodal points, a MOS AND gate inputting another of the differential output voltages output from differential transistor part via two nodal point, and a bipolar output transistor part inputting an OR output voltage and an AND output voltage from bases of high and low voltage side bipolar transistors, respectively, to output an output voltage from a connection point thereof.

5 Claims, 5 Drawing Sheets

ECL-CMOS LEVEL CONVERTER CIRCUIT

BACKGROUND OF THE INVENTION

The present invention relates to an ECL-CMOS level converter circuit, and more particularly to an ECL-CMOS level converter circuit having a logical function.

Description of the Related Arts

A conventional ECL-CMOS (emitter coupled logic-complementary metal oxide semiconductor circuit) level converter circuit having a logical function is used in a CPU which operates addresses of a memory by a clock of 20 to 30 MHz and, as shown in FIG. 1, is comprised of a bipolar differential amplifier 1 including a pair of bipolar differential transistor parts 1a and 1b, a CMOS differential amplifier 3 and a CMOS logic circuit 4 which are coupled with one another by a cascade connection.

The bipolar differential transistor part 1a includes a pair bipolar transistors Q1 and Q2. The collectors of the bipolar transistors Q1 and Q2 are connected to a high voltage VCC power source via respective resistors R1 and R2 and the emitters of the bipolar transistors Q1 and Q2 are connected to a low voltage VEE power source via a low current power source I1. Similarly, the bipolar differential transistor part 1b includes a pair of bipolar transistors Q3 and Q4. The collectors of the bipolar transistors Q3 and Q4 are connected to the high voltage VCC power source via respective resistors R3 and R4 and the emitters of the bipolar transistors Q3 and Q4 are connected to the low voltage VEE power source via a low current power source I2. A pair of input terminals A and B are connected to the bases of the bipolar transistors Q1 and Q3 of the bipolar differential transistor parts 1a and 1b, respectively, and a reference voltage Vref is input the base of the bipolar transistors Q2 and Q4 of the bipolar differential transistor parts 1a and 1b via a reference voltage terminal. The CMOS differential amplifier 3 includes pairs of MOS transistors M5 and M6, M7 and M8, M9 and M10, and M11 and M12, and the CMOS logic circuit 4 includes pairs of MOS transistors M13 and M14, and M15 and M16. An output terminal C is coupled to the CMOS logic circuit 4. The high voltage VCC and the low voltage VEE are directly applied to the CMOS differential amplifier 3 and the CMOS logic circuit 4.

Next, the operation of the conventional ECL-CMOS level converter circuit described above will be described in connection with voltage waveforms shown in FIG. 2. Input voltages VA and VB having respective ECL levels are input to the bipolar differential transistor parts 1a and 1b from the respective input terminals A and B. In this case, a higher voltage level than the reference voltage Vref is called a "H" level and a lower voltage level than the reference voltage Vref is called a "L" level. Now, when the input voltage VA of the "L" level is applied to the input terminal A at a period T1, the bipolar transistor Q1 becomes off and the bipolar transistor Q2 becomes on. As a result, a collector voltage VA1 of the bipolar transistor Q1 at a collector nodal point A1 is raised to the high voltage VCC, and a voltage VA2 at a collector nodal point A2 as a collector voltage of the bipolar transistor Q2 is dropped by a voltage determined by I1·R2 from the high voltage VCC. Hence, the MOS transistor M5 of the CMOS differential amplifier 3 is turned on, and a current flows to the transistor M7 to turn on the mirror transistor M8. Further, the MOS transistor M6 is turned off, and a voltage level VAa at a nodal point Aa becomes the low voltage VEE.

On the contrary, as shown at a period T3 in FIG. 2, when the input voltage VA of the "H" level is applied to the input terminal A, the bipolar transistor Q1 is on and the bipolar transistor Q2 is off. Hence, the voltage VA1 at the nodal point A1 as the collector voltage of the bipolar transistor Q1 is dropped by a voltage determined by I1·R1 from the high voltage VCC, and the nodal point voltage VA2 is raised to the high voltage VCC. Hence, the MOS transistor M5 is turned off, and no current flows to the transistor M7 to turn off the mirror transistor M8. Also, the MOS transistor M6 is turned on, and the voltage level VAa at the nodal point Aa becomes the high voltage VCC. As to the bipolar differential transistor part 1b, a relationship between the input voltage VB at the input terminal B and a voltage level VBa at a nodal point Ba of the CMOS differential amplifier 3 is the same as the above-described operation, and thus the detailed description thereof can be omitted for brevity.

Now, when both the nodal point voltages VAa and VBa are the "L" level at the period T1, the P-channel MOS transistors M13 and M14 of the CMOS logic circuit 4 are turned on, and the N-channel MOS transistors M15 and M16 are turned off. Thus, a voltage VC at the output terminal C becomes the high voltage VCC. Then, when the nodal point voltage VAa is the "L" level and the nodal point voltage VBa is the "H" level at a period T2, the transistors M14 and M16 are turned on and the transistors M13 and M15 are turned off. Hence, similarly, the output voltage VC is the high voltage VCC. Next, the nodal point voltage VAa is the "H" level and the nodal point voltage VBa is the "L" level at the period T3, in turn, the transistors M13 and M15 are turned on and the transistors M14 and M16 are turned off. Therefore, the output voltage VC is the high voltage VCC.

Lastly, when both the nodal point voltages VAa and VBa are the "H" level at a period T4, the transistors M13 and M14 are turned off and the transistors M15 and M16 are turned on. Hence, the output terminal voltage VC is the low voltage VEE.

As described above, with respect to the input voltages VA and VB having the two ECL levels, the conventional level converter circuit can logically operate a NAND circuit for outputting a voltage signal of a CMOS level.

This conventional ECL-CMOS level converter circuit has the three stage cascade connection structure constituted by the bipolar differential amplifier, the CMOS differential amplifier and the CMOS logic circuit. Thus the number of logical stages is large. Further, the P-channel MOSFETs are used for driving the high level of the output, and thus the operation speed can not be raised beyond approximately 1 nS.

SUMMARY OF THE INVENTION

It is therefore an object of the present invention to provide an ECL-CMOS level converter circuit in view of the aforementioned defects of the prior art, which is capable of operating at a high speed and has a simple circuit structure.

In accordance with one aspect of the present invention, there is provided an ECL-CMOS level converter circuit including first and second differential amplifier circuits. The first differential amplifier circuit receives a first input signal having ECL voltage levels and a first reference voltage. The first differential amplifier circuit amplifies the first input signal and outputs first and second differential output nodal point signals responsive to the first input signal. The first and second differential output nodal point signals have mutually opposite phases and vary between first voltage levels. The second differential amplifier circuit receives a second input signal having ECL voltage levels and a second reference voltage. The second differential amplifier circuit amplifies the second input signal and outputs third and fourth differential output nodal point signals responsive to the second input signal. The third and fourth differential output nodal point signals have mutually opposite phases and vary between the first voltage levels. A level conversion logic circuit is included for converting the differential output nodal point signals to an output signal varying between voltage levels differing from the first voltage levels of the differential output nodal point signals. The level conversion logic circuit includes a first MOS logic gate mechanism having first and second MOSFETs coupled between a high voltage power source and an output terminal. The first MOSFET has a gate receiving the second differential output nodal point signal and the second MOSFET has a gate receiving the fourth differential output nodal point signal. The level conversion circuit also includes a second MOS logic gate mechanism having third and fourth channel MOSFETs coupled between the high voltage power source and a low voltage power source. The third MOSFET has a gate receiving the third differential output nodal point signal, and the fourth MOSFET has a gate receiving the third differential output nodal point signal. The first, second, third, and fourth MOSFETs have a channel type that is the same. The level conversion logic circuit additionally includes high and low voltage side bipolar transistors. The high voltage side bipolar transistor has a base receiving a logical output voltage of the first MOS logic gate mechanism, a collector connected to the high voltage power source, and an emitter connected to the output terminal. The low voltage side bipolar transistor has a base receiving a logical output voltage of the second MOS logic gate mechanism, a collector connected to the output terminal, and an emitter connected to the low voltage power source.

In a preferable ECL-CMOS level converter circuit, the first MOS logic gate means is an OR gate and the second MOS logic gate means is an AND gate. Further, the level conversion-logic circuit can include a NAND circuit for outputting a NAND voltage to the output terminal with respect to a plurality of the input voltages input to the differential transistor parts.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 3:
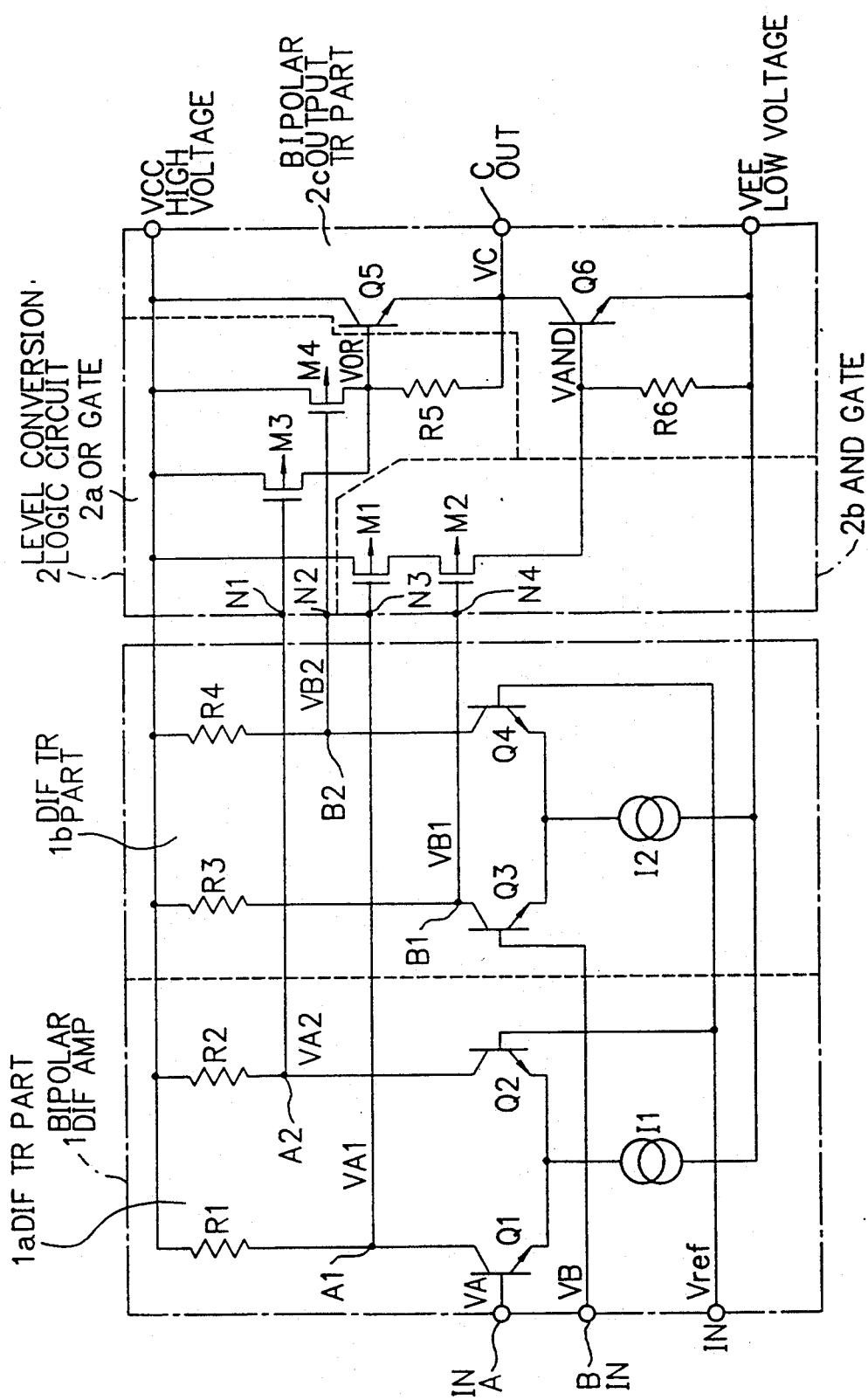
FIG. 3 is a circuit diagram of one embodiment of an ECL-CMOS level converter circuit according to the present invention.

Referring now to the drawings, there is shown in FIG. 3 one embodiment of an ECL-CMOS level converter circuit according to the present invention. In this embodiment, a level conversion-logic circuit 2 is provided in place of a cascade connection circuit of the CMOS differential amplifier 3 and the CMOS logic circuit 4 in the conventional ECL-CMOS level converter circuit shown in FIG. 1.

Figure 1:
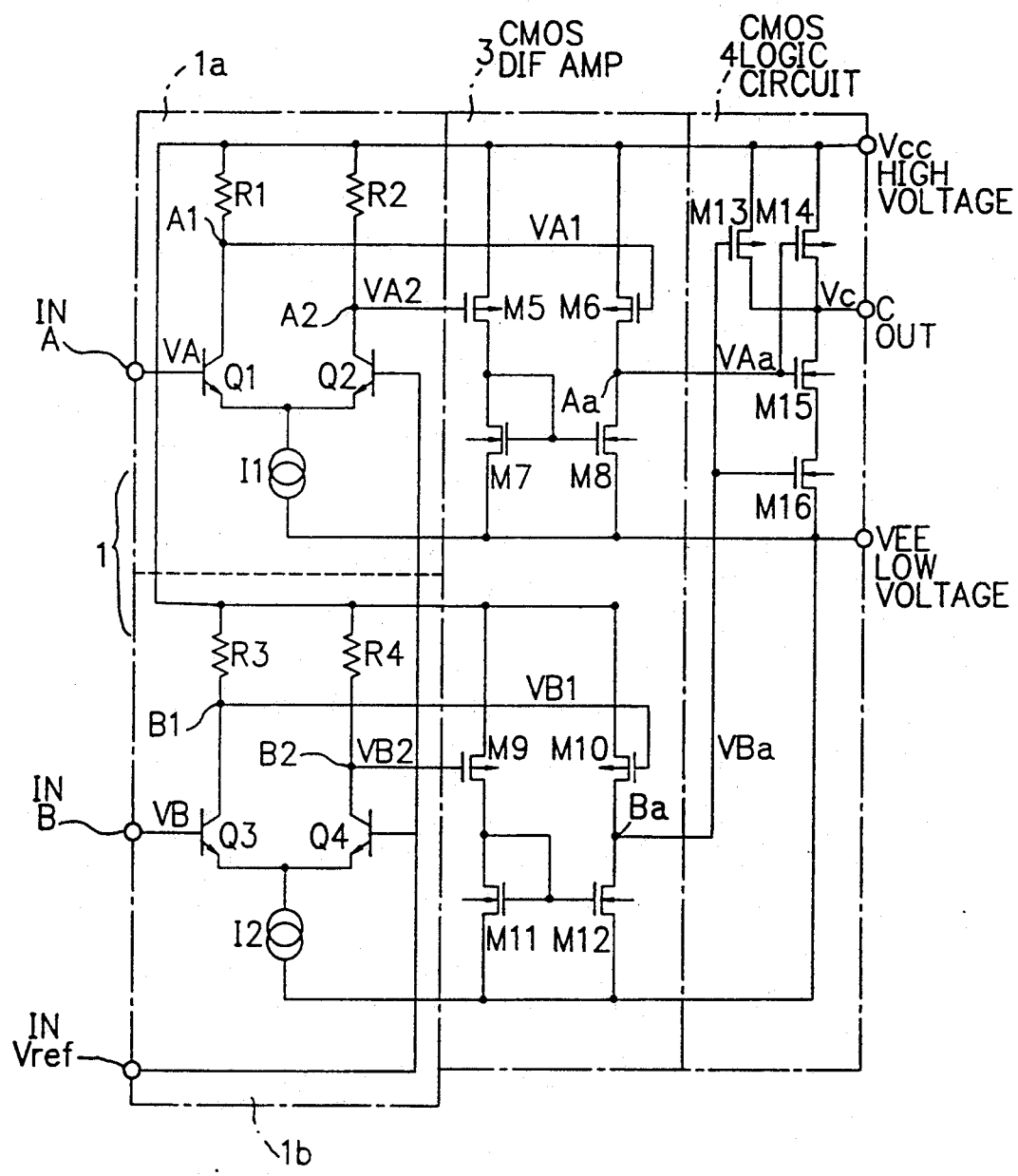
FIG. 1 is a circuit diagram of a conventional ECL-CMOS level converter circuit.
Figure 2:
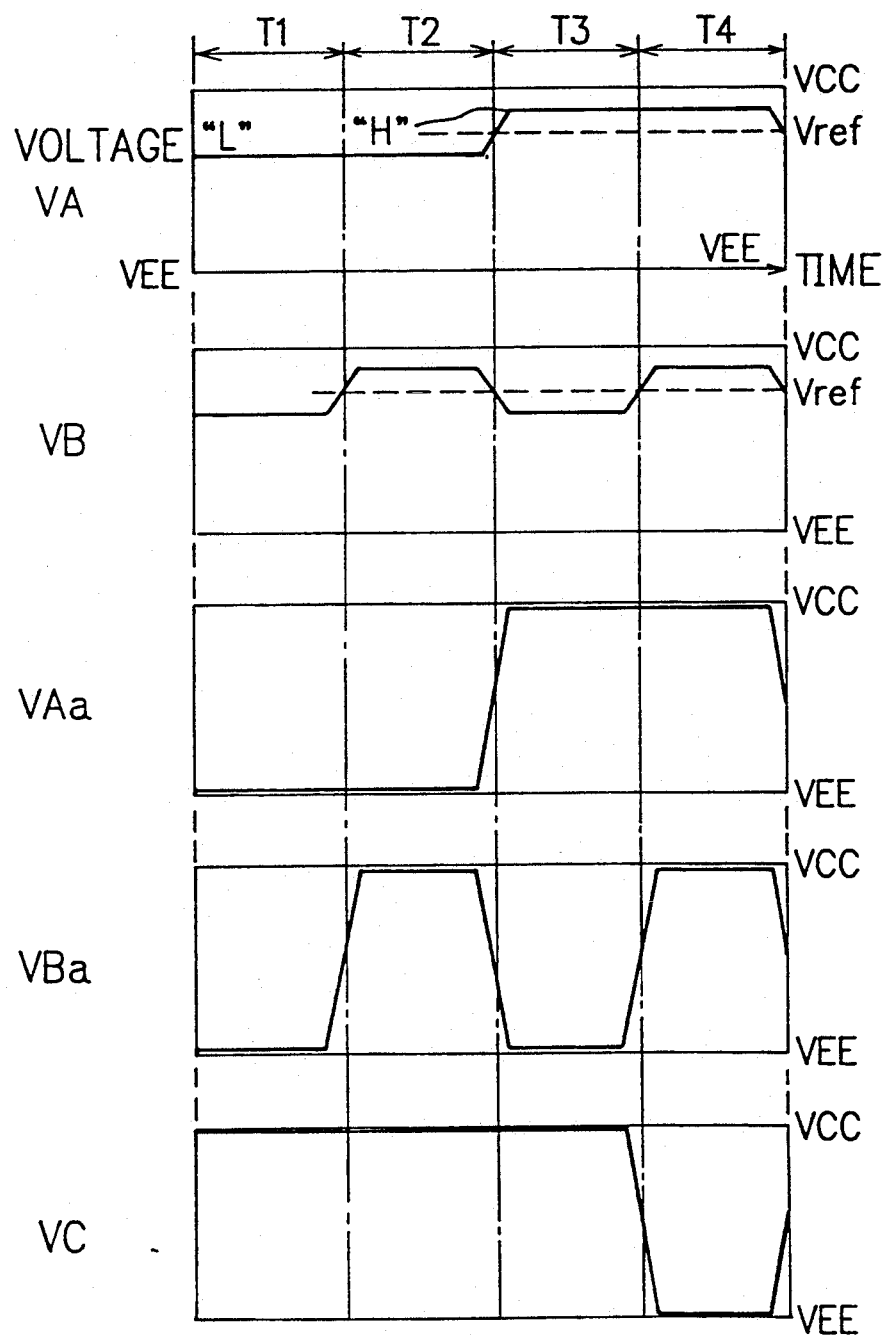
FIG. 2 is a time chart showing voltage waveforms at nodal points for explaining an operation of the circuit shown in FIG. 1.

That is, as shown in FIG. 3, the ECL-CMOS level converter circuit comprises a bipolar differential amplifier 1 including a pair of bipolar differential transistor parts 1a and 1b, having the same construction as the bipolar differential amplifier 1 shown in FIG. 1 and the level conversion-logic circuit 2. In a bipolar differential transistor part 1a, an input voltage VA having an ECL level is input to an input terminal A and a reference voltage Vref is input to a reference voltage terminal to output differential output voltages VA1 and VA2 having mutually opposite phases at collector nodal points A1 and A2 of bipolar transistors Q1 and Q2. In a bipolar differential transistor part 1b, an input voltage VB having an ECL level is input to an input terminal B and the reference voltage Vref is input to the reference voltage terminal to output differential output voltages VB1 and VB2 having mutually opposite phases at collector nodal points B1 and B2 of bipolar transistors Q3 and Q4.

The level conversion-logic circuit 2 includes a logical OR gate 2a comprised of a pair of P-channel MOS transistors M3 and M4 coupled in parallel, an logical AND gate 2b comprised of a pair of P-channel MOS transistors M1 and M2 coupled in series, and a bipolar output transistor part 2c comprised of a pair of bipolar transistors Q5 and Q6 coupled in series. A coupling point between the bipolar transistors Q5 and Q6 is connected with the output terminal C. The OR gate 2a is inserted between the high voltage VCC power source and the output terminal C via a resistor R5, and the differential output voltages VA2 and VB2 at gate nodal points N1 and N2 connected with the respective collector nodal points A2 and B2 are input to the transistors M3 and M4, respectively. The AND gate 2b is inserted between the high voltage VCC power source and the low voltage VEE power source via a resistor R6, and the differential output voltages VA1 and VB1 at gate nodal points N3 and N4 connected with the respective collector nodal points A1 and B1 are input to the transistors M1 and M2, respectively. An OR output voltage VOR is input to the base of the high voltage side transistor Q5, and an AND output voltage VAND is input to the base of the low voltage side transistor Q6.

Figure 4:
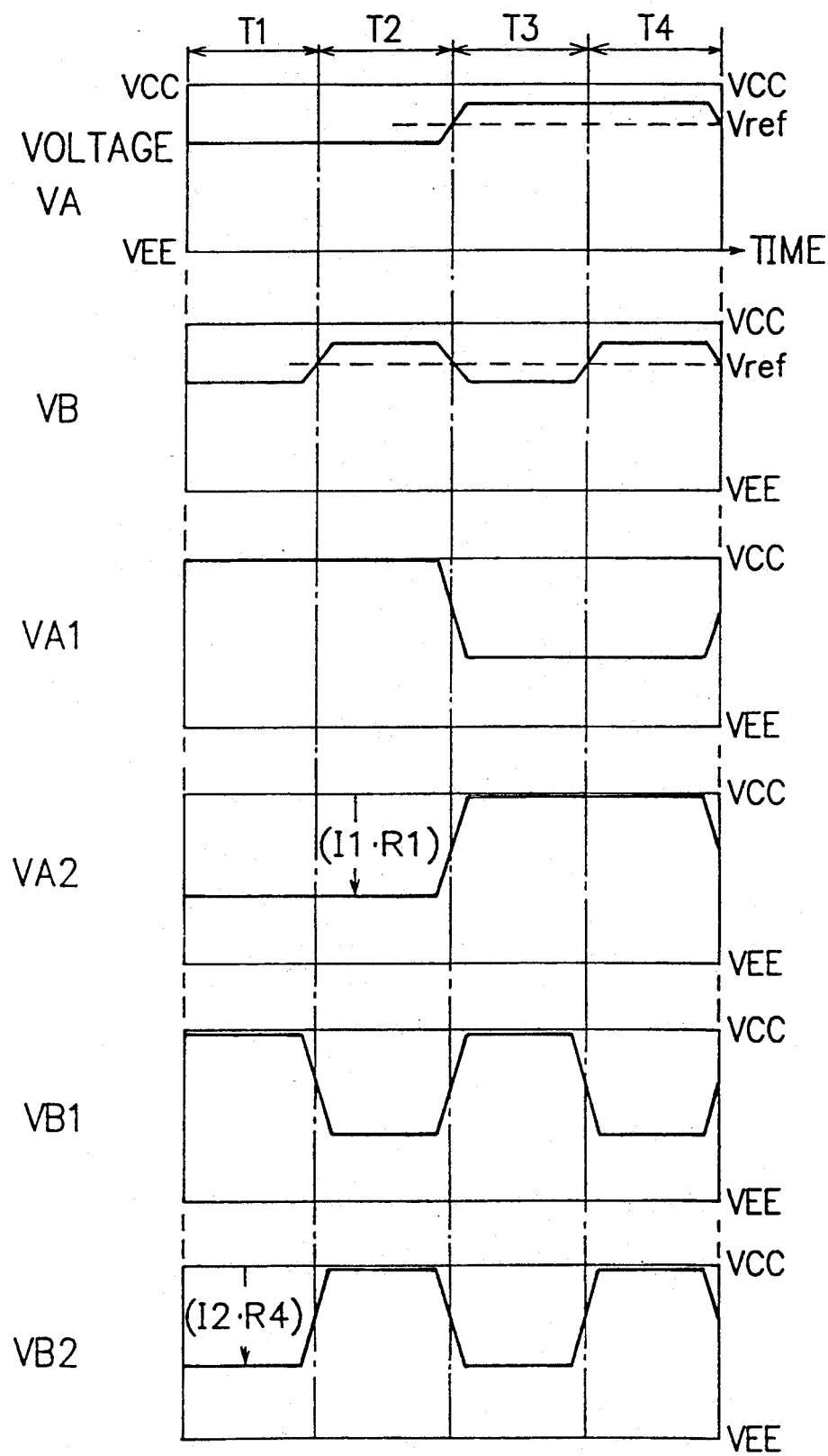
FIG. 4 is a time chart showing voltage waveforms at nodal points for explaining an operation of the circuit shown in FIG. 3.
Figure 5:
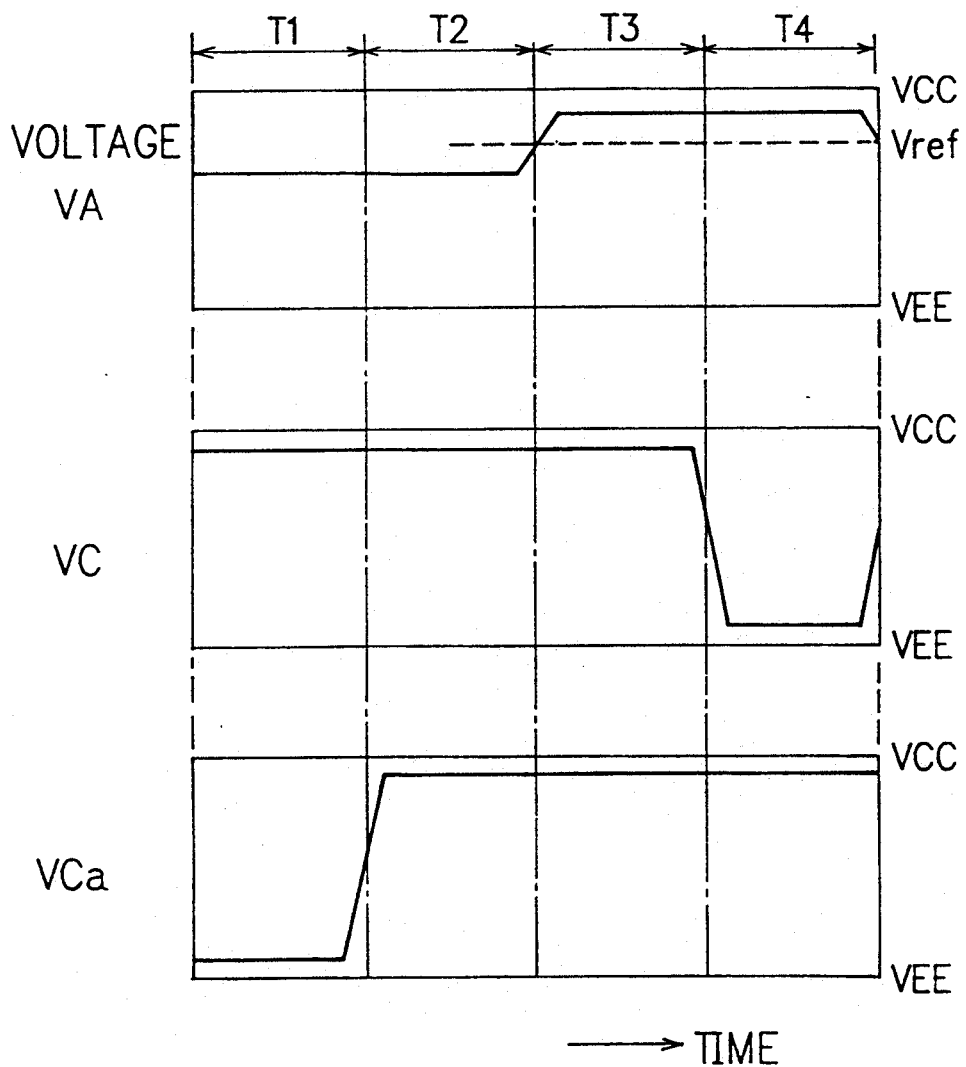
FIG. 5 is a time chart showing voltage waveforms at input and output voltage terminals for explaining the operation of an ECL-CMOS level converter circuit according to the present invention.

Next, the operation of the above-described ECL-CMOS level converter circuit shown in FIG. 3 will be described in detail in connection with FIG. 4 showing voltage waveforms at the nodal points appearing in FIG. 3. First, at a period T1, when the input voltages VA and VB having the "L" level are applied to the input terminals A and B, respectively, the bipolar transistor Q1 is off and the bipolar transistor Q2 is on in the bipolar differential transistor part 1a. Hence, the voltage VA1 at the collector nodal point A1 is raised to the high voltage VCC, and in turn, the voltage VA2 at the collector nodal point A2 is dropped by a voltage of I1·R2 from the high voltage VCC. Also, since the bipolar transistor Q3 is off and the bipolar transistor Q4 is on, the voltage VB1 at the collector nodal point B1 is raised to the high voltage VCC, and in turn, the voltage VB2 at the collector nodal point B2 is dropped by a voltage of I2·R4 from the high voltage VCC in the bipolar differential transistor part 1b. Accordingly, the P-channel MOS transistors M1 and M2 constituting the AND gate 2b of the level conversion-logic circuit 2 are off, and thus no current flows to the base of the transistor Q6 of the bipolar output transistor part 2c to allow the transistor Q6 to be off. Further, the P-channel MOS transistors M3 and M4 constituting the OR gate 2a are on, and thus the current flows to the base of the transistor Q5 of the bipolar output transistor part 2c. Hence, the voltage VC at the output terminal C is raised to near the high voltage VCC, as shown in FIG. 5.

Then, at a period T2, when the input voltage VA having the "L" level and the input voltage VB having the "H" level are input to the input terminals A and B, respectively, the bipolar transistor Q1 is off and the bipolar transistor Q2 is on. Hence, the nodal point voltage VA1 is raised to the high voltage VCC and the nodal point voltage VA2 is fallen by the voltage of I1·R2 from the high voltage VCC. Also, the bipolar transistor Q3 is on and the bipolar transistor Q4 is off. Thus, the nodal point voltage VB1 is dropped by a voltage of I2·R3 from the high voltage VCC and the nodal point voltage VB2 is raised to the high voltage VCC. Hence, the MOS transistors M2 and M3 are on and the MOS transistors M1 and M4 are off. Accordingly, no current flows to the base of the transistor Q6 and the current flows to the base of the transistor Q5. Thus, the transistor Q5 is turned on, and the output terminal voltage VC is raised to near the high voltage VCC.

Next, at a period T3, when the input voltage VA having the "H" level and the input voltage VB having the "L" level are input to the input terminals A and B, respectively, the bipolar transistor Q1 is on and the bipolar transistor Q2 is off. Hence, the nodal point voltage VA1 is dropped by a voltage of I1·R1 from the high voltage VCC and the nodal point voltage VA2 is raised to the high voltage VCC. Also, the bipolar transistor Q3 is off and the bipolar transistor Q4 is on. Thus, the nodal point voltage VB1 is raised to the high voltage VCC and the nodal point voltage VB2 is fallen by the voltage of I2·R4 from the high voltage VCC. Hence, the MOS transistors M1 and M4 are on and the MOS transistors M2 and M3 are off. Accordingly, no current flows to the base of the transistor Q6 and the current flows to the base of the transistor Q5. Thus, the transistor Q5 is turned on, and the output terminal voltage VC is raised to near the high voltage VCC.

Lastly, at a period T4, when the input voltages VA and VB having the "H" level are applied to the input terminals A and B, respectively, the bipolar transistor Q1 is on and the bipolar transistor Q2 is off. Hence, the nodal point voltage VA1 is dropped by a voltage of I1·R1 from the high voltage VCC and the nodal point voltage VA2 is raised to the high voltage VCC. Also, the bipolar transistor Q3 is on and the bipolar transistor Q4 is off. Thus, the nodal point voltage VB1 is dropped by a voltage of I2·R3 from the high voltage VCC and the nodal point voltage VB2 is raised to the high voltage VCC. Hence, the MOS transistors M1 and M2 are on and the MOS transistors M3 and M4 are off. Accordingly, no current flows to the base of the transistor Q5 and on the contrary, the current flows to the base of the transistor Q6. Thus, the transistor Q6 is turned on, and the output terminal voltage VC is dropped to near the low voltage VEE.

As described above, in this embodiment, the ECL-CMOS level converter circuit can function as a NAND circuit for outputting an output terminal voltage VC of CMOS levels with respect to the input voltages VA and VB of two ECL levels. Further, similarly, a NAND circuit of at least three input voltages can be readily obtained.

In another embodiment of an ECL-CMOS level converter circuit according to the present invention, having the same construction as the embodiment shown in FIG. 3, except that the nodal points A1 and A2 are replaced with each other and the nodal points B1 and B2 are also replaced with each other, as shown in FIG. 5, an output terminal voltage VCa of CMOS levels with respect to the input voltages VA and VB having two ECL levels can be output, and thus the ECL-CMOS level converter circuit can operate as a logical OR circuit outputting the output terminal voltage VCa of two levels. Further, a logical OR circuit of at least three input voltages can be readily obtained.

As described above, according to the present invention, a combination of a level converter circuit and a logic circuit is provided with a smaller logical stage number and an approximately 20% faster operation speed compared with a conventional circuit, and, since the output stage is comprised of the bipolar transistors, a large driving ability can be obtained.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An ECL-CMOS level converter circuit comprising:

a bipolar differential amplifier including a plurality of differential circuits, each differential circuit including first and second emitter coupled bipolar transistors, the first emitter coupled bipolar transistor having a base receiving an input voltage having an ECL level from an input terminal and the second emitter coupled bipolar transistor having a base receiving a reference voltage from a reference voltage terminal, each of the emitter coupled bipolar transistors having a collector coupled to a high voltage power source via a load resistor and an emitter coupled to a low voltage power source via a low current power source, the first and second emitter coupled bipolar transistors respectively outputting differential output nodal point voltages having mutually opposite phases from the respective collectors; and a level conversion logic circuit including:
first MOS logic gate means having a plurality of P-type channel MOSFETs coupled between the high voltage power source and an output terminal, each of the plurality of P-type channel MOSFETs of the first MOS logic gate means having a gate receiving one of the differential output nodal point voltages output from the bipolar transistors of each differential circuit, second MOS logic gate means having a plurality of P-type channel MOSFETs coupled between the high voltage power source and the voltage power source, each of the plurality of P-type channel MOSFETs of the second MOS logic gate means having a gate receiving another of the differential output nodal point voltages output from the bipolar transistor of each differential transistor part, and bipolar output transistor means having a high voltage side bipolar transistor and a low voltage side bipolar transistor, the high voltage side bipolar transistor having a base receiving a logical output voltage of the first MOS logic gate means, a collector connected to the high voltage power source, and an emitter connected to the output terminal, the low voltage side bipolar transistor having a base receiving a logical output voltage of the second MOS logic gate means, a collector to the output terminal, and an emitter connected to the low voltage power source.

2. The ECL-CMOS level converter circuit as claimed in claim 1 wherein the first MOS logic gate means is an OR gate and the second MOS logic gate means is an AND gate, and wherein the level conversion logic circuit includes an NAND circuit for outputting a voltage to the output terminal having a logical value of a NAND with respect to the input voltages having an ECL level input to the differential circuits.

3. The ECL-CMOS level converter circuit as claimed in claim 1 wherein the bipolar differential amplifier contains two differential circuits.

4. An ECL-CMOS level converter circuit comprising:

a first differential amplifier circuit which receives a first input signal having ECL voltage levels and a first reference voltage, the first differential amplifier circuit amplifying the first input signal and outputting first and second differential output nodal point signals responsive to the first input signal, the first and second differential output nodal point signals having mutually opposite phases and varying between first voltage levels;

a second differential amplifier circuit which receives a second input signal having ECL voltage levels and a second reference voltage, the second differential amplifier circuit amplifying the second input signal and outputting third and fourth differential output nodal point signals responsive to the second input signal, the third and fourth differential output nodal point signals having mutually opposite phases and varying between the first voltage levels; and a level conversion logic circuit for converting the differential output nodal point signals to an output signal varying between voltage levels differing from the first voltage levels of the differential output nodal point signals, the level conversion logic circuit including:

first MOS logic gate means having first and second MOSFETs coupled between a high voltage power source and an output terminal, the first MOSFET having a gate receiving the second differential output nodal point signal and the second MOSFET having a gate receiving the fourth differential output nodal point signal, second MOS logic gate means having third and fourth channel MOSFETs coupled between the high voltage power source and a low voltage power source, the third MOSFET having a gate receiving the third differential output nodal point signal, and the fourth MOSFET having a gate receiving the third differential output nodal point signal, wherein the first, second, third, and fourth MOSFETs have a channel type that is the same, a high voltage side bipolar transistor having a base receiving a logical output voltage of the first MOS logic gate means, a collector connected to the high voltage power source, and an emitter connected to the output terminal, and a low voltage side bipolar transistor having a base receiving a logical output voltage of the second MOS logic gate means, a collector connected to the output terminal, and an emitter connected to the low voltage power source.

5. The ECL-CMOS level converter circuit as claimed in claim 4 wherein the channel type of the first, second, third, and fourth MOSFETs is a P-type channel.

* * * * *

UNITED STATES PATENT AND TRADEMARK OFFICE
CERTIFICATE OF CORRECTION

PATENT NO. : 5,329,183
DATED : July 12, 1994
INVENTOR(S) : Tamegaya

It is certified that error appears in the above-indentified patent and that said Letters Patent is hereby corrected as shown below:

```
Column 7, Line 6, after "the" insert --low--;
         Line 11, change "transistor" to --transistors--;
         Line 23, after "collector" insert --connected--.
```

Signed and Sealed this

Twenty-fifth Day of October, 1994

Attest:

BRUCE LEHMAN

*Attesting Officer*    *Commissioner of Patents and Trademarks*